(12) United States Patent
Patton et al.

(10) Patent No.: US 10,732,249 B2
(45) Date of Patent: Aug. 4, 2020

(54) REACTIVE NEAR-FIELD ANTENNA MEASUREMENT

(71) Applicant: Ether Capital Corporation, Wilmington, DE (US)

(72) Inventors: Ruska Patton, Calgary (CA); Kasra Payandehjoo, Calgary (CA)

(73) Assignee: Ether Capital Corporation, Wilmington, DE (US)

( * ) Notice: Subject to any disclaimer, the term of this patent is extended or adjusted under 35 U.S.C. 154(b) by 0 days.

(21) Appl. No.: 15/515,566

(22) PCT Filed: Nov. 10, 2015

(86) PCT No.: PCT/CA2015/051164
§ 371 (c)(1),
(2) Date: Mar. 29, 2017

(87) PCT Pub. No.: WO2016/074080
PCT Pub. Date: May 19, 2016

(65) Prior Publication Data
US 2017/0248674 A1  Aug. 31, 2017

Related U.S. Application Data

(60) Provisional application No. 62/078,698, filed on Nov. 12, 2014.

(51) Int. Cl.
*G01R 35/00* (2006.01)
*G01R 29/10* (2006.01)
(52) U.S. Cl.
CPC ........... *G01R 35/005* (2013.01); *G01R 29/10* (2013.01)

(58) Field of Classification Search
CPC .............................. G01R 35/005; G01R 29/10
See application file for complete search history.

(56) References Cited

U.S. PATENT DOCUMENTS 3,866,227 A   2/1975   Ruvin
3,971,026 A   7/1976   Toman
(Continued)

FOREIGN PATENT DOCUMENTS

CN   103630761 A   3/2014
CN   103701535 A   4/2014
(Continued)

OTHER PUBLICATIONS

Petre, Peter et al.; Planar Near-Field to Far-Field Transformation Using an Array of Dipole Probes; IEEE Transactions on Antennas and Propagation; Apr. 1994; vol. 42, No. 4, pp. 534-537.
(Continued)

*Primary Examiner* — Jeff W Natalini
(74) *Attorney, Agent, or Firm* — Fletcher Yoder PC

(57) ABSTRACT

A method of calibrating or correcting near field or far field data from a scanner board array of integrated measuring probes that are electronically switched to capture near-field data from an antenna-under-test (AUT) and having a board output includes the steps of coupling a calibrating probe with one of the measuring probes, measuring the power through the measuring probe and the calibrating probe and isolating the effect of the RF path from the measuring probe to the board output by removing the effect of the calibrating probe, and repeating for each measuring probe. Also disclosed are methods for correcting for scattering effects and loading effects on the AUT.

20 Claims, 7 Drawing Sheets

(56) References Cited

U.S. PATENT DOCUMENTS

| | | | |
|---|---|---|---|
| 4,239,010 | A | 12/1980 | Amburn |
| 4,378,559 | A | 3/1983 | Rittenbach |
| 4,453,164 | A | 6/1984 | Patton |
| 5,019,768 | A | 5/1991 | Criswell et al. |
| 5,229,776 | A | 6/1993 | Kelly et al. |
| 5,243,352 | A | 9/1993 | Sezai |
| 5,270,723 | A | 12/1993 | Lopez et al. |
| 5,365,241 | A | 11/1994 | Williams et al. |
| 5,675,343 | A | 10/1997 | Champeau |
| 5,936,588 | A | 8/1999 | Rao et al. |
| 5,969,661 | A | 10/1999 | Benjamin |
| 6,127,987 | A | 10/2000 | Maruyama et al. |
| 6,163,726 | A | 12/2000 | Wolf |
| 6,166,705 | A | 12/2000 | Mast et al. |
| 6,191,744 | B1* | 2/2001 | Snow .............. G01R 29/10 342/360 |
| 6,208,287 | B1 | 3/2001 | Sikina et al. |
| 6,456,235 | B1 | 9/2002 | Utley et al. |
| 6,750,822 | B2 | 6/2004 | Fritzel |
| 6,762,726 | B2 | 7/2004 | Alden et al. |
| 7,119,739 | B1 | 10/2006 | Struckman |
| 7,130,755 | B2 | 10/2006 | Lee et al. |
| 7,222,033 | B1 | 3/2007 | Newson et al. |
| 7,308,233 | B2 | 12/2007 | Allen |
| 7,368,305 | B2 | 5/2008 | van der Weide et al. |
| 7,672,640 | B2 | 3/2010 | Nyshadham et al. |
| 8,502,546 | B2 | 8/2013 | Nyshadham et al. |
| 2009/0316667 | A1* | 12/2009 | Hirsch .............. H04B 1/406 370/338 |
| 2011/0105059 | A1* | 5/2011 | Gaal .............. H04W 52/146 455/127.1 |
| 2011/0193566 | A1 | 8/2011 | Nyshadham et al. |
| 2011/0306306 | A1* | 12/2011 | Reed .............. H04B 17/0085 455/67.11 |
| 2012/0053879 | A1* | 3/2012 | Chang .............. G01C 19/00 702/104 |
| 2016/0043778 | A1* | 2/2016 | Sikina .............. H04B 5/0043 455/41.1 |

FOREIGN PATENT DOCUMENTS

| | | |
|---|---|---|
| DE | 4010488 A1 | 10/1991 |
| EP | 0665447 | 8/1995 |
| WO | 2008021907 A2 | 2/2008 |
| WO | 2009046516 | 4/2009 |

OTHER PUBLICATIONS

Emscan Corporation, EMI Scanning Solutions and Assessment Tools to help you Solve EMC Design Problems in a Single Design Cycle, Calgary, Canada—Brochure.

R.C. Johnson, H.A. Ecker, and J.S. Hollis, "Determination of far-field antenna patterns from near-field measurements," Proceedings of the IEEE, vol. 61, No. 12, pp. 1668-1694, Dec. 1973.

C.H. Schmidt, M.M. Leibfritz, and T.F. Elbert, "Fully Probe-Corrected Near-Field Far-Field Transformation Employing Plane Wave Expansion and Diagonal Translation Operators," IEEE Transactions on Antennas and Propagation, vol. 56, No. 3, pp. 737-746, Mar. 2008.

Emscan Corporation—Rfxpert Brochure and Datasheet (RFX2-Datasheet-v1.pdf).

http://www.satimo.com/sites/www/satimo.com/files/StarLab_2014_bd_0.pdf.

J.J.H. Wang, "An experiment on the theory and practices of planar near-field measurement," IEEE Transactions on Antennas and Propagation, vol. 36, No. 6, pp. 746, 753, Jun. 1988.

EMSCAN Corporation "How to Measure All Types of Antennas Using Very-Near-Field Measurement", Nov. 2012 URL: http://www.emscan.com/downloads/RFxpert/Brochure_Datasheet/RFxpert_White_Paper_1_v4-printhouse.pdf.

Farncombe, "Famcombe's MIMO WiFi CPE Test Services", Mar. 2014, URL: http://www.farncombe.com/wp-content/uploads/2014/03/Test-Wifi-Test-Service-Brochure-Rel.4.pdf.

Patton et al. "Verifying very near-field antenna measurements: Algorithm evaluation and comparison to conventional methods," Feb. 2014, URL: https://www.emscan.com/downloads/rfxpert/brochure_datasheet/rfxpert_whitepaper.pdf, Wayback Machine (web.archive.org) shows first occurrence for this document on Feb. 1, 2014.

Payandehjoo et al, "De-embedding the effect of a printed array of probes on planar very-near-field measurements," in Antenna Measurements & Applications (CAMA), 2014 10.1109/CAMA.2014.7003433.

"IEEE Recommended Practice for Near-Field Antenna Measurements; IEEE Std. 1720-2012", IEEE Standard, IEEE; Dec. 5, 2012; pp. 1-102 (XP068050209).

Zang et al.: "An Effective Method of Probe Calibration in Phase-Resolved Near-Field Scanning for EMI Application"; IEEE Transaction on Instrumentation and Measurement, IEEE Service Center, vol. 62, No. 3, Mar. 1, 2013; pp. 648-658 (XP011492994).

Chen et al.; "Diagnosis of EMI to laptop WWAN device from TFT-LCD driver using non-contact measurement-baswed transfer function technique"; 2010 IEEE International Symposium on Electromagnetic Compatibility (EMC), Jul. 25, 2010; pp. 301-304 (XP031978527).

Partial Supplementary European Search Report for EP Application No. 158589326.9, dated Jul. 5, 2018; 21 pgs.

\* cited by examiner

Scattering effects

Place known antenna on scanner and measure near field data and far field radiated power

Compare near field data and far field radiated power to expected results generated by simulation of known antennas

Adjust near field and far field calibration factors to account for discrepancy

Repeat for all antennas and save adjustments in a new calibration file

FIGURE 6

Loading effects

| Place known antenna on scanner and measure far field radiated power |

| Compare far field radiated power to expected results generated measurement of known antennas in antenna chamber |

| Repeat for all antennas and save discrepancies between measured data and known results |

| Adjust far field calibration factors to minimize error in all antennas measurements simultaneously. Save resulting adjustment in new calibration file |

FIGURE 7

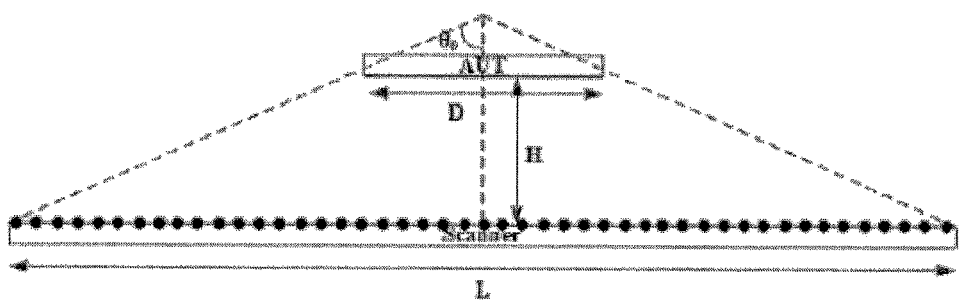

FIGURE 8

REACTIVE NEAR-FIELD ANTENNA MEASUREMENT

FIELD OF THE INVENTION

The present invention relates to systems and methods of reactive or very near-field measurement for characterizing antenna performance, including methods of de-embedding various effects of a probe system on the antenna.

BACKGROUND

Near-field measurement systems are widely used for the characterization of large and/or low frequency antennas for which far-field or compact range measurement systems become too costly and in some cases impractical to use. The compact size of these near-field measurement systems allows for integration of measurement probes in planar, circular, and other array configurations. If the measurements are done by an array of sensors, the mechanical movements of the antenna-under-test (AUT) or device under test (DUT) are reduced or eliminated, and hence the measurement time is reduced. In the case of planar near-field measurements, the simplicity of the near-field to far-field transformation algorithms along with the array based approach results in almost real-time far-field characterization of the AUT in a hemisphere. A further reduction in measurement system size can be achieved if measurements can be done in the reactive region of the near-field, which is traditionally avoided because of the potential for reflection and coupling with the antenna.

Measurement in this reactive region is sometimes called very near-field measurement. An example of such a planar very-near-field antenna measurement system is the RFxpert® product (EMSCAN Corporation, Canada), which comprises an array of 1600 rapidly switchable probes printed on a 45×45 cm printed circuit board (PCB). The orthogonal H-field components (magnitude and phase) measured by the probes are transformed to a far-field pattern in a hemisphere using a plane-wave-spectrum (PWS) expansion. Despite the benefit of extremely fast electronic switching between the probes (rather than mechanical movements of the AUT in a chamber), the presence of the printed array of probes in the antenna's very near-field region creates a mutual coupling effect, which alters the fields around the antenna in at least two ways. First, a ground plane effect arises because the scanner PCB has an array of half-loop probes on a solid ground plane, which disturbs the near-fields by introducing a discontinuity in the medium and imposes new boundary conditions. Second, a mutual coupling effect arises because the scanner PCB and the individual measurement probes load the AUT, altering its radiation performance; for example, altering its input impedance. The mutual coupling effect is AUT-dependent and is difficult to compensate for. When measuring in the very-near-field region, it is not desirable to ignore the loading effect of the scanner PCB on the AUT, particularly at low frequencies, such as below 1 GHz, for example.

Therefore, there is a need in the art for systems and methods for mitigating or de-embedding these effects from the very near-field or reactive near-field measurements, in an effort to improve the accuracy of the resulting far-field results.

SUMMARY OF THE INVENTION

The present invention relates to scanner systems and methods of calibrating and/or correcting measurement made using a very near-field scanner of an antenna-under-test (AUT). The scanner may comprise a device which uses an array of integrated probes that are electronically switched to capture very near-field data in proximity of an AUT, and transforms the near field data into far-field data. Such measurement devices may measure the phase and amplitude of the magnetic field (H-Field) in two orthogonal directions, in the reactive near-field, using H-field probes and project this data to the far-field, using a far field transformation method such as the planar aperture distribution to angular spectrum transformation or plane wave spectrum (PWS) transformation.

In one aspect, the invention may comprise a method of calibrating a scanner comprising an scanner board array of integrated measuring probes that are electronically switched to capture near-field data from an AUT and each having an RF path from probe to a board output, comprising the steps of:
(a) coupling a calibrating probe with one of the measuring probes to create a magnetic field of known intensity inside the measuring probe.
(b) measuring the power through the measuring probe and the calibrating probe and isolating the effect of the RF path from the measuring probe to the board output by removing the effect of the calibrating probe;
(c) repeating steps (a) and (b) for each measuring probe;
(d) creating a calibration file for the array comprising a correction for each measuring probe RF path.

Each of the measuring probes may comprise an H-field half loop probe having a conducted RF amplitude output. The H-field intensity inside each loop may be estimated from the conducted RF amplitude output of the scanner board by measuring the power through the loop and the calibrating probe coupled to the loop with a vector network analyzer.

In another aspect, the invention may comprise a method of correcting measurements to account for the scattering effect of the scanner, wherein said correction is calculated by comparing the measurements actually obtained from the scanner with results obtained from a software simulation.

In another aspect, the invention may comprise a method of correcting measurements to account for the loading effect of the scanner on the AUT, wherein the correction is calculated by comparing the measurements actually obtained from the scanner with results obtained from empirical testing.

In another aspect, the invention may comprise an AUT measurement device comprising an array of integrated probes that are electronically switched to capture near-field data in proximity of the AUT, wherein the device comprises a processor adapted to transform near-field data to the far-field using a far field transformation method, and to implement any one or all of the calibration or correction steps described or claimed herein.

BRIEF DESCRIPTION OF THE DRAWINGS

In the drawings, like elements are assigned like reference numerals. The drawings are not necessarily to scale, with the emphasis instead placed upon the principles of the present invention. Additionally, each of the embodiments depicted are but one of a number of possible arrangements utilizing the fundamental concepts of the present invention. The drawings are briefly described as follows:

FIG. 6 is a schematic flowchart of another embodiment of a calibration method.

FIG. 7 is a schematic flowchart of another embodiment of a calibration method.

FIG. 8 shows a solid angle where the predicted far-field pattern is accurate.

DETAILED DESCRIPTION OF PREFERRED EMBODIMENTS

The present invention is intended to work with antenna measurement devices which use an array of integrated probes that are electronically switched. Exemplary devices include those described in U.S. Pat. No. 8,502,546, the entire contents of which are incorporated herein by reference, for all purposes, where permitted. The scope of the claims appended hereto should not be limited by specific embodiments set forth in the description or the examples, but should be given the broadest interpretation consistent with the description as a whole.

The present invention may comprise antenna measurement devices which use an array of integrated probes that are electronically switched to capture near-field data in proximity of an AUT and transforms them into far-field data. Such measurement devices measure the phase and amplitude of the magnetic field (H-field) in two orthogonal directions, in the reactive near-field, using H-field probes and project this data to the far-field using a far field transformation method such as the planar aperture distribution to angular spectrum transformation or plane wave spectrum (PWS) transformation.

Calibration of the system for accurate near and far-field predictions is difficult for at least the following three reasons. Firstly, the probe response from the H-field in the loop to the RF output of the scanner board (path loss) varies significantly from one probe to the other. Secondly, presence of the scanner board itself disturbs the fields surrounding the AUT and may affect probe readings as well as far-field predictions. Thirdly, the scanner probe and its system itself can load the AUT and hence alter its radiation performance.

Aspects of the invention comprise adaptations to such devices and methods to calibrate and/or correct the near-field data and the resulting far-field projections to account for individual measurement probe variability and the predictable coupling effects of the array of measurement probes.

In one embodiment, a calibration method involves a de-embedding method and is implemented in connection with a scanner which comprises a printed array of H-field measurement probes (half loops) that are sequentially switched on in order to capture the field that is linked in each of the probes. The first step in the calibration process is to estimate the H-field intensity inside each loop from the conducted RF amplitude at the output of the scanner board. This calibration is necessary because the RF paths from different loops on the scanner board to the RF output (path loss) are significantly different and highly sensitive to manufacturing tolerances. This calibration is also made difficult since a known H-field in the loop is difficult to generate and there is no commonly available equipment to measure the ratio between H-field and RF amplitude.

Figure 1:
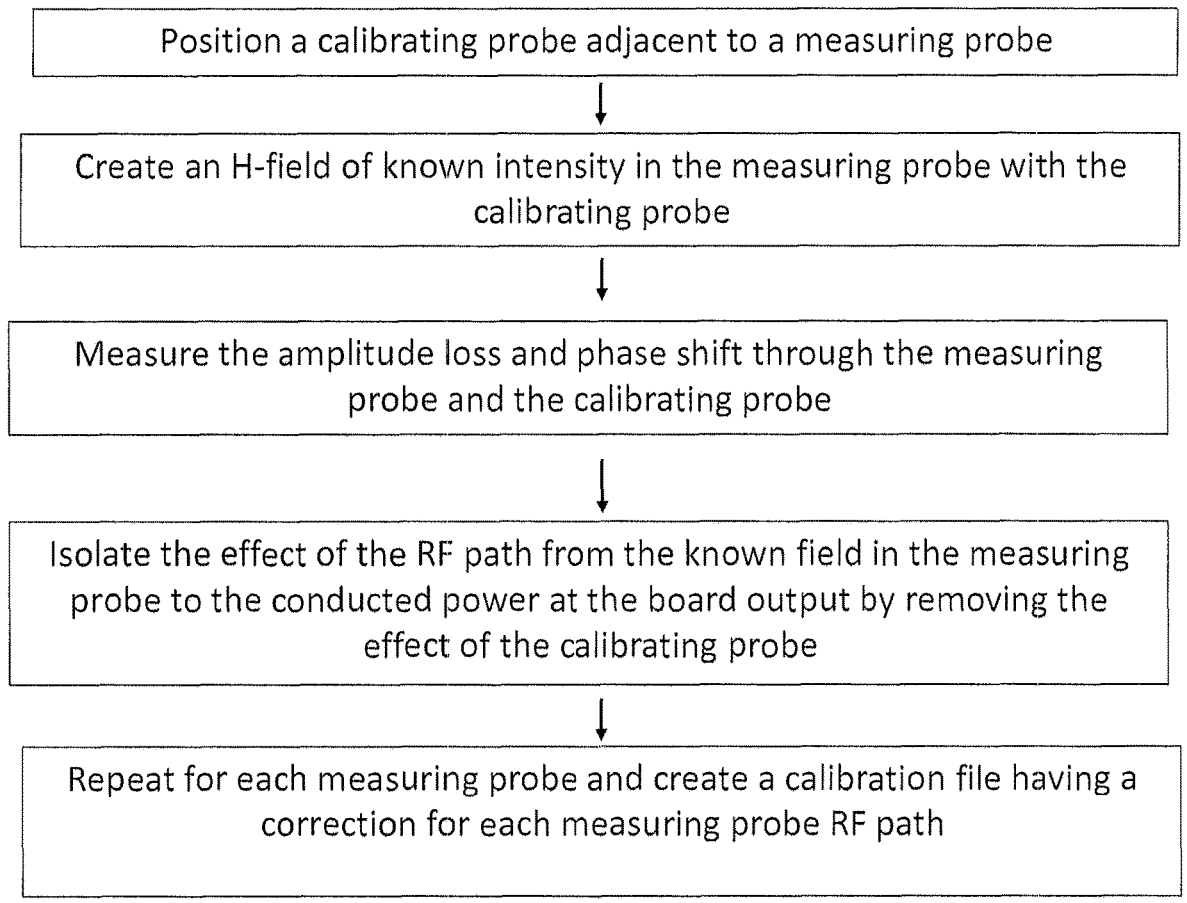
FIG. 1 is a schematic flowchart of one embodiment of a calibration method.

The present invention provides a calibration method by measuring the power through a combination of the scanner board (5) with a H-field half loop measurement probe antenna (10) and a calibrating probe comprising a secondary loop antenna (12), and to de-embed the path loss by removing the effect of the secondary loop antenna (12). The algorithm is shown in FIG. 1. This concept is illustrated schematically in FIG. 2, By coupling a secondary loop antenna (12) to the scanner probe (10), the two ports "a" (14) and "c" (16) of the superset (combination of the scanner board and secondary loop antenna) are accessible for measurement using a vector network analyzer (VNA). The effect of the RF paths from the feed point of the probe, "b" (18), to the output of the board, "a" (14), can be extracted by considering the two alternative subsystems shown schematically in FIG. 3. For simplicity, in one embodiment, the secondary loop antenna (12) is chosen to be identical to the H-field probes (10). Subsystem 2 in FIG. 3 is almost identical for all probe locations. In the case that it is not identical, any variation in the response of a scanner loop probe can be attributed to its unique scanner path loss, so all probes can be treated as identical. Therefore, the network parameters of Subsystem 1 can be derived from those of the system of FIG. 2 by considering the cascade of subsystems illustrated in FIG. 3.

$$[T''] = [T][T']. \tag{1}$$

Figure 2:
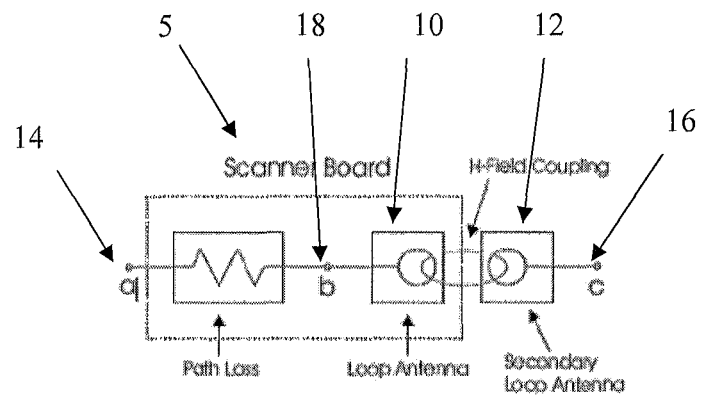
FIG. 2 shows a schematic view of a single measuring probe in the scanner board along with a coupled secondary loop antenna.
Figure 3:
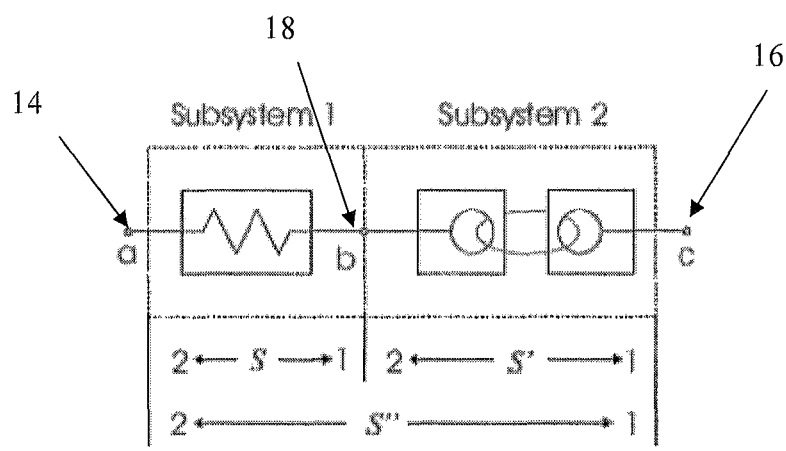
FIG. 3 shows a schematic view of two cascaded subsystems and their associated S-matrices created by the coupling shown in FIG. 2.
Figure 4:
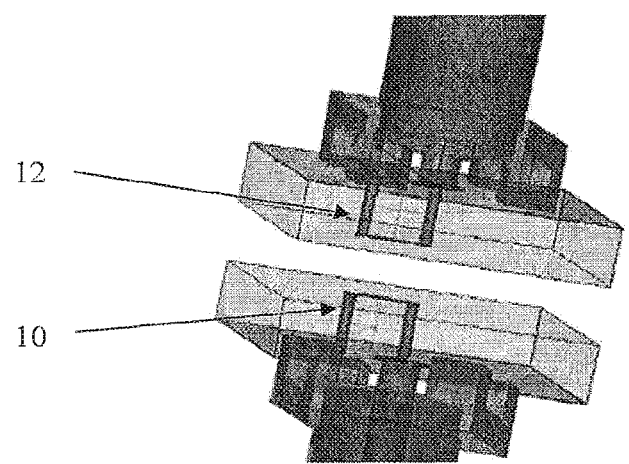
FIG. 4 shows a schematic representation of the model used to simulate the response of the two probes placed 2 mm apart.
Figure 5:
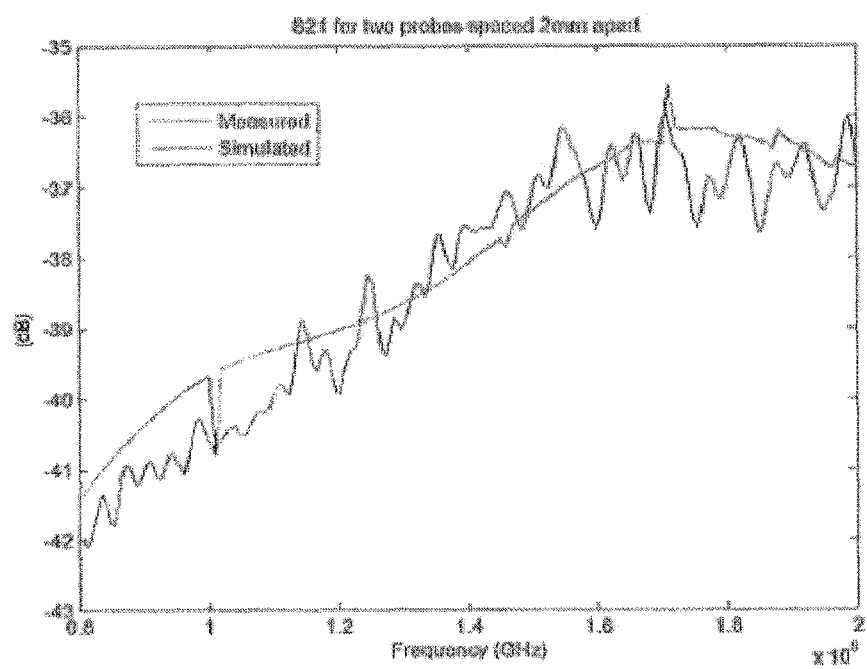
FIG. 5 shows the measured response versus simulated response of two probes separated by 2 mm.

The T matrices in Equation (1) are the transfer matrices of the two port systems in FIGS. 1 and 2, and can be derived from S-parameter matrices. The system denoted by T' represents the two coupled loops between points "b" and "c" as depicted in FIG. 3. The RF path (matrix T) is easily calculated once the value of T'' is measured using a VNA, and T' is estimated from simulations, using well-known commercially available simulation software. FIG. 4 shows the measured versus simulated coupling in the two-antenna link of FIG. 4. As may be seen, link loss estimation within about ±1 dB may be achieved.

In an automated calibration process, an XYZ positioning system is used for accurate positioning of the secondary loop antenna (12) above each of the individual probes (10) on the scanner board (5) in order to accumulate the required T matrices. Finally, the ratio of A/m in the loop to V at point "b" (18) in FIG. 1 (AF or antenna factor) is given in Equation 2 that may be obtained from simulations:

$$AF = 10 \log_{10}\left(\frac{H}{V_{rms}}\right). \tag{2}$$

If the loops feed into a 50Ω transmission line in the same manner, then knowledge of the RF amplitude at the beginning of the transmission line can provide knowledge of the H-field in the loop. The estimated matrix T, together with the AF, fully characterizes the scanner system of FIG. 3, which may then be used to calibrate the output of each probe on the scanner board.

As mentioned above, insertion of the scanner board (10) in the medium perturbs the near-fields by imposing new boundary conditions. As an extreme example, if the dielectric is replaced by air, the effect of the measurement probes is ignored, and the board is assumed to be very large, the scanner can be approximated by an infinitely large ground plane. Presence of such a ground plane diminishes the tangential components of the E-field and doubles up the H-fields tangent to its surface. In one embodiment, to de-embed the actual effect of the scanner board, at least one of two levels of adjustment are performed, and preferably both. Firstly, as shown in FIG. 6, for numerous non-volatile reference antennas (covering the entire 300 MHz-6 GHz frequency range), the H-field distribution that is measured using the measurement device is compared to simulation results which are obtained using well known and commercially available simulation software, and are adjusted accordingly. Because of the large ground plane effect, the distribution of magnetic field is similar to that in free space with only the magnitude being significantly affected. Secondly, as shown in FIG. 7, at each frequency point, the total radiated power (TRP) that is estimated using the near-field to far-field transformation may be corrected to the values actually measured in a standard measurement using a reliable anechoic chamber. This will capture any effects that are not dealt with in the near-field distribution adjustment.

Additionally, the presence of the measurement probes themselves and the related hardware in the near-field region of the AUT can potentially alter the antenna's radiation performance by loading it. The most obvious example of such a loading effect is a change in the AUT's input impedance. Unlike other effects, this loading effect is AUT-dependent and is therefore very difficult to de-embed. Increasing the separation between the AUT and the scanner board can minimize this effect; however, it would reduce the solid angle where far-field results are accurate. This is mainly due to the fact that, as depicted in FIG. 8, antenna radiation beyond this solid angle ($\theta_0$) from the z-axis, is not captured by the scanner:

$$\theta_0 = \arctan\frac{L-D}{2H}. \quad (3)$$

In one embodiment, in order to counteract this unwanted loading effect, an empirical approach may be undertaken. A measurement probe antennas may be tested empirically in an anechoic chamber, and the test results used to correct measurement results obtained from the scanner. For example, in one instance, 47 antennas from a wide variety of commercially available sources were characterized in a standard measurement processes in an anechoic chamber. Various antenna topologies, such as monopole, dipole, planar inverted-F, loop, patch, etc. were included in the investigations. The antennas were also measured on an EMSCAN RFxpert™ unit and the data was used to populate correction factors from approximately 1000 measurement points of total radiated power (TRP) to account for the loading effect of the scanner board on the AUT. This empirical data was compared to the actual scanner results, and average correction factors for any given frequency for a specific measurement probe were calculated. These correction factors may then be used in subsequent measurements using the measuring antennas.

Figure 9:
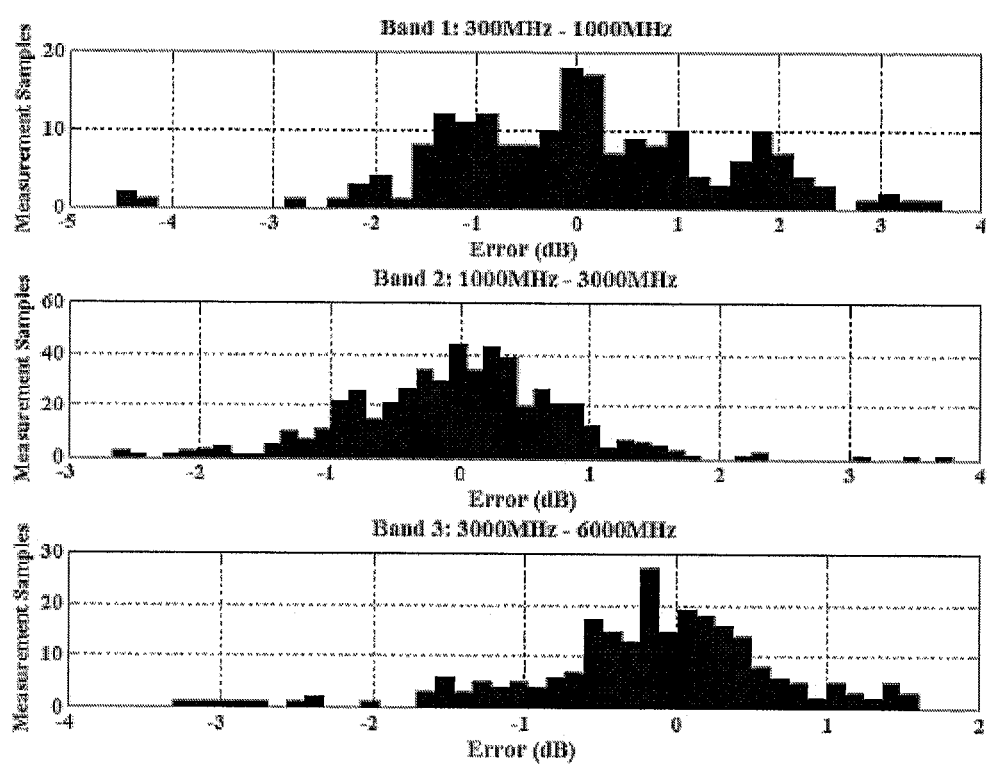
FIG. 9 shows a graph showing distribution of an antenna measurement device versus chamber error at different bands.

In one embodiment, at least one, and preferably each of the different levels of correction and calibration explained herein are applied to the near-field measurement results actually obtained from the measurement device. FIG. 9 depicts the error distribution of the measured efficiencies compared to control data obtained from testing in an anechoic chamber. In plotting the errors in FIG. 9, the 300 MHz-6 GHz band is divided into three separate bands and the histogram of the measurement error in each band are shown, Table I summarizes statistical properties of the error. It suggests that for low frequencies below 1 GHz, the error is distributed around 0 dB, with a standard deviation of about 1.5 dB. Above 1 GHz, the errors are also distributed around 0 dB, but with a lower standard deviation of error, less than 1 dB.

TABLE I

ERROR STATISTICS IN DIFFERENT BANDS.

| Band 1: 300 MHz-1 GHz | | Band 2: 1 GHz-3 GHz | | Band3: 3 GHz-6 GHz | |
|---|---|---|---|---|---|
| $\sigma$ | N | $\sigma$ | N | $\sigma$ | N |
| 1.54 | 195 | 0.81 | 517 | 0.94 | 247 |

$\sigma$ is the standard deviation of measurement error.
N is the number of measurement samples at the band.

Embodiments of the present invention relate to methods of de-embedding the effect of one or all of the aforementioned effects. A combination of measurement and simulated results is used to estimate the probe response and the RF path loss. Measurements of reference antennas across the band are then compared with simulations to correct near-field readings of the measurement device. A second layer of correction is applied to the predicted far-field total radiated power (TRP) values of these reference antennas to match control data obtained in an anechoic chamber. Finally, the loading effect of the scanner board on the AUT is minimized through an empirical approach to minimize errors. In one embodiment, the standard deviation of efficiency measurement error may be lowered to below 1.5 dB.

Figure 10:
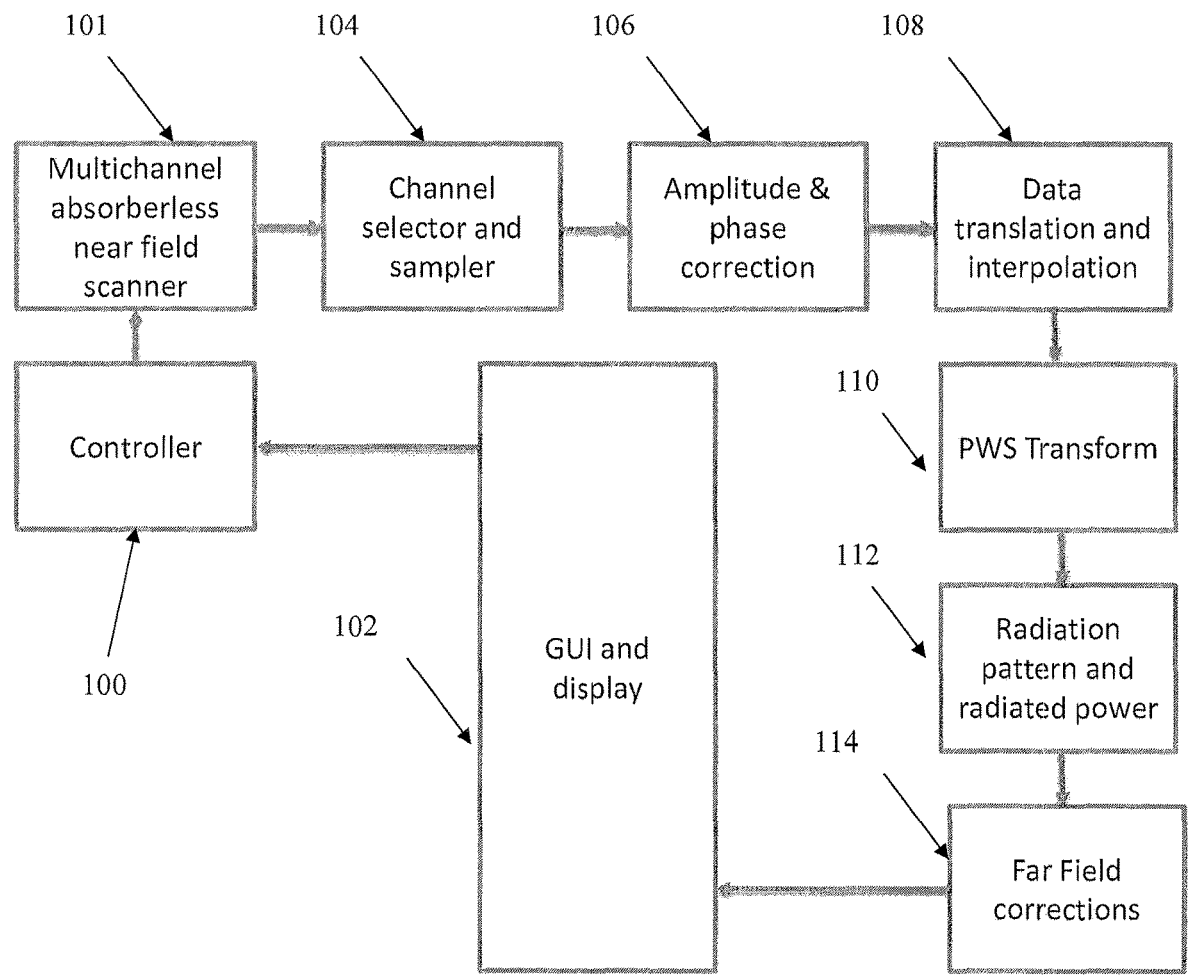
FIG. 10 is a schematic representation of one embodiment of a processing engine of a system of the present invention.

Aspects of the present invention are described with reference to steps or methods which can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified. In one embodiment, a processing engine is shown schematically in FIG. 10, comprising a controller (100) operatively connected to a scanner (101) and a graphical user interface GUI and display (102). The output from the scanner board goes to a channel selector and sampler module (104) and then to an amplitude and phase correction module (106), where path loss corrections may take place, along corrections to near field data to account for ground plane scattering effect. A data translation and interpolation module (108) leads to the plane wave spectrum transformation module (110) which result in radiation pattern and radiated power measurements (112). Far field corrections for AUT loading then take place in module (114), as well as far field corrections for the scattering effect.

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The corresponding structures, materials, acts, and equivalents of all means or steps plus function elements in the claims appended to this specification are intended to include any structure, material, or act for performing the function in combination with other claimed elements as specifically claimed.

References in the specification to "one embodiment", "an embodiment", etc., indicate that the embodiment described may include a particular aspect, feature, structure, or characteristic, but not every embodiment necessarily includes that aspect, feature, structure, or characteristic. Moreover, such phrases may, but do not necessarily, refer to the same embodiment referred to in other portions of the specification. Further, when a particular aspect, feature, structure, or characteristic is described in connection with an embodiment, it is within the knowledge of one skilled in the art to affect or connect such module, aspect, feature, structure, or characteristic with other embodiments, whether or not explicitly described. In other words, any module, element or feature may be combined with any other element or feature in different embodiments, unless there is an obvious or inherent incompatibility, or it is specifically excluded.

It is further noted that the claims may be drafted to exclude any optional element. As such, this statement is intended to serve as antecedent basis for the use of exclusive terminology, such as "solely," "only," and the like, in connection with the recitation of claim elements or use of a "negative" limitation. The terms "preferably," "preferred," "prefer," "optionally," "may," and similar terms are used to indicate that an item, condition or step being referred to is an optional (not required) feature of the invention.

The singular forms "a," "an," and "the" include the plural reference unless the context clearly dictates otherwise. The term "and/or" means any one of the items, any combination of the items, or all of the items with which this term is associated. The phrase "one or more" is readily understood by one of skill in the art, particularly when read in context of its usage.

The following references are incorporated herein by reference, where permitted, as if reproduced in their entirety.

[1] R. C. Johnson, H. A. Ecker, and J. S. Hollis, "Determination of far-field antenna patterns from near-field measurements," Proceedings of the IEEE, vol. 61, no. 12, pp. 1668-1694, December 1973.
[2] C. H. Schmidt, M. M. Leibfritz, and T. F. Eibert, "Fully Probe-Corrected Near-Field Far-Field Transformation Employing Plane Wave Expansion and Diagonal Translation Operators," IEEE Transactions on Antennas and Propagation, vol. 56, no. 3, pp. 737-746, March 2008.
[3] Emscan Corporation—Rfxpert Brochure and. Datasheet (RFX2-Datasheet-v1.pfd)
[4] http://www.satimo.com/sites/www.satimo.com/files/StarLab_2014_bd_0.pdf
[5] J. J. H. Wang, "An examination of the theory and practices of planar near-field measurement," IEEE Transactions on Antennas and Propagation, vol. 36, no. 6, pp. 746, 753, June 1988.
[6] U.S. Pat. No. 7,672,640
[7] U.S. Pat. No. 8,502,546

What is claimed is:

1. A method of calibrating a scanner comprising a scanner board array of integrated measuring probes that are electronically switched to capture near-field data from an antenna under test (AUT) and having a board output, comprising:
　for each measuring probe of the array of integrated measuring probes:
　　coupling a calibrating probe with one of the measuring probes;
　　measuring power through the measuring probe and the calibrating probe;
　　determining a path loss of a path from the measuring probe to the board output based at least in part on the power to isolate an effect of the path from the measuring probe to the board output; and
　　determining a correction to the scanner based at least in part on the path loss.

2. The method of claim 1 wherein the measuring probes comprise H-field half loop probes.

3. The method of claim 2, comprising determining an H-field intensity inside each loop of the H-field half loop probes based at least in part on the power.

4. The method of claim 3, wherein determining the path loss comprises determining the path loss based at least in part on the power and the respective H-field intensity of one or more loops of the H-field half loop probes.

5. The method of claim 1 wherein the calibrating probe is substantially identical to the measuring probe.

6. The method of claim 1, wherein:
　measuring the power comprises:
　　determining first H-field distribution measurements for the antenna on the scanner, wherein the antenna is configured to operate at a first frequency; and
　　determining second H-field distribution measurements for the antenna, wherein the second H-field distribution measurements correspond to a simulation of the antenna;
　determining the path loss comprises:
　　determining a difference between the first H-field distribution measurements and the second H-field distribution measurements; and determining the correction comprises:
adjusting a calibration factor of the scanner based at least in part on the difference to account for a scattering effect of the scanner, wherein the scanner is configured to produce the board output based at least in part on the calibration factor.

7. The method of claim 6, wherein:
measuring the power comprises:
determining a first total radiated power (TRP) based at least in part on the first H-field distribution measurements, a near-field to far-field transformation, or a combination thereof;
determining a second TRP based at least in part on empirical testing of the antenna;
determining the path loss comprises:
determining an additional difference between the first TRP and the second TRP; and
determining the correction comprises:
adjusting a TRP calibration factor of the scanner based at least in part on the additional difference, wherein the scanner is configured to produce the board output based at least in part on the TRP calibration factor.

8. The method of claim 6, wherein the first H-field distribution measurements comprise near-field data, far-field radiated power, or both.

9. The method of claim 6, wherein the calibration factor comprises a near-field calibration factor, a far-field calibration factor, or both.

10. The method of claim 6, wherein:
measuring the power comprises:
determining, third H-field distribution measurements for an additional antenna on the scanner, wherein the additional antenna is configured to operate at a second frequency;
determining fourth H-field distribution measurements for the additional antenna, wherein the second H-field distribution measurements correspond to a simulation of the additional antenna;
determining the path loss comprises:
determining, an additional difference between the third H-field distribution measurements and the fourth H-field distribution measurements; and
determining the correction comprises:
adjusting an additional calibration factor of the scanner based at least in part on the additional difference, wherein the scanner is configured to produce the board output based at least in part on the additional calibration factor.

11. The method of claim 1, wherein:
measuring the power comprises:
determining a first far-field radiated power measurement for the antenna on the scanner;
determining a second far-field radiated power measurement for the antenna, wherein the second far-field radiated power measurement is determined based at least in part on empirical testing of the antenna;
determining the path loss comprises:
determining a difference between the first far-field radiated power measurement and the second far-field radiated power measurement; and
determining the correction comprises:
adjusting a far-field calibration factor of the scanner based at least in part on the difference to account for a loading effect of at least one measuring probe of the array of integrated measuring probes, wherein the scanner is configured to produce the board output based at least in part on the far-field calibration factor.

12. The method of claim 11, wherein:
measuring the power comprises:
determining a first total radiated power (TRP) based at least in part on the first far-field radiated power measurement, a near-field to far-field transformation, or a combination thereof;
determining a second TRP based at least in part on additional empirical testing of the antenna;
determining the path loss comprises:
determining an additional difference between the first TRP and the second TRP; and
determining the correction comprises:
adjusting a TRP calibration factor of the scanner based at least in part on the additional difference, wherein the scanner is configured to produce the board output based at least in part on the TRP calibration factor.

13. The method of claim 1, comprising measuring the power through the measuring probe and the calibrating probe with a vector network analyzer.

14. The method of claim 1, comprising estimating an effect of the calibrating probe on the path loss based at least in part on a simulation, wherein determining the path loss comprises determining the path loss based at least in part on the power and the effect of the calibrating probe.

15. The method of claim 1, comprising creating a magnetic field of known intensity inside the measuring probe with the calibrating probe.

16. The method of claim 1, comprising creating a calibration file for the array comprising the correction for each measurement probe.

17. An antenna measurement device comprising:
a scanner comprising a scanner board array of integrated measuring probes that are configured to be electronically switched to capture near-field data from an antenna under test (AUT) and having a board output; and
one or more processors, wherein the one or more processors are configured to:
for each measuring probe of the array of integrated measuring probes:
cause a calibrating probe to be coupled with one of the measuring probes;
cause power to be measured through the measuring probe and the calibrating probe;
determine a path loss of a path from the measuring probe to the board output based at least in part on the power to isolate an effect of the path from the measuring probe to the board output; and
determine a correction to the scanner based at least in part on the path loss.

18. The antenna measurement device of claim 17, wherein the measuring probes comprise H-field half loop probes.

19. The antenna measurement device of claim 17, wherein the calibrating probe is substantially identical to the measuring probe.

20. An antenna measurement device comprising:
a scanner comprising a scanner board array of integrated measuring probes that are configured to be electronically switched to capture near-field data from an antenna under test (AUT) and having a board output; and
one or more processors, wherein the one or more processors are configured to:

for each measuring probe of the array of integrated measuring probes:
  cause a calibrating probe to be coupled with one of the measuring probes;
  cause power to be measured through the measuring probe and the calibrating probe at least in part by:
    determining first H-field distribution measurements for the antenna on the scanner at a first frequency; and
    determining second H-field distribution measurements for the antenna corresponding to a simulation of the antenna;
  determine a path loss of a path from the measuring probe to the board output to isolate an effect of the path from the measuring probe to the board output at least in part by determining a difference between the first H-field distribution measurements and the second H-field distribution measurements; and
  determine a correction to the scanner comprising adjusting a calibration factor of the scanner based at least in part on the difference to account for a scattering effect of the scanner, wherein the scanner is configured to produce the board output based at least in part on the calibration factor.

* * * * *